(12) United States Patent
Choi et al.

(10) Patent No.: US 12,376,460 B2
(45) Date of Patent: Jul. 29, 2025

(54) DISPLAY DEVICE

(71) Applicant: LG Display Co., Ltd., Seoul (KR)

(72) Inventors: Moonsun Choi, Seoul (KR); Junghun Choi, Paju-si (KR); SungJin Park, Paju-si (KR); Seonha Yu, Paju-si (KR); SeungHyun Lee, Paju-si (KR); Hyeonseo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 491 days.

(21) Appl. No.: 17/974,373

(22) Filed: Oct. 26, 2022

(65) Prior Publication Data
US 2023/0200152 A1 Jun. 22, 2023

(30) Foreign Application Priority Data
Dec. 21, 2021 (KR) .................. 10-2021-0183575

(51) Int. Cl.
| | |
|---|---|
| H10K 59/126 | (2023.01) |
| H10K 59/121 | (2023.01) |
| H10K 59/122 | (2023.01) |
| H10K 59/123 | (2023.01) |
| H10K 59/35 | (2023.01) |
| H10K 59/65 | (2023.01) |

(52) U.S. Cl.
CPC ......... *H10K 59/126* (2023.02); *H10K 59/122* (2023.02); *H10K 59/351* (2023.02)

(58) Field of Classification Search
CPC .. H10K 59/126; H10K 59/122; H10K 59/351; H10K 59/65; H10K 59/121
See application file for complete search history.

(56) References Cited

U.S. PATENT DOCUMENTS

| | | | |
|---|---|---|---|
| 2019/0115407 A1* | 4/2019 | Cho ................. | H10D 86/0212 |
| 2020/0176718 A1* | 6/2020 | Tang ................. | H10K 50/865 |
| 2020/0235187 A1* | 7/2020 | Bae .................. | H10K 59/126 |
| 2020/0273927 A1 | 8/2020 | Oh et al. | |
| 2020/0373372 A1 | 11/2020 | Chung et al. | |
| 2021/0241671 A1 | 8/2021 | Lee et al. | |
| 2022/0208869 A1* | 6/2022 | Jeong ............... | H10K 59/124 |

* cited by examiner

*Primary Examiner* — Mohsen Ahmadi
(74) *Attorney, Agent, or Firm* — Fenwick & West LLP

(57) ABSTRACT

A display device is disclosed that includes a display panel comprising a display area and a non-display area, wherein the display area comprises a first area and a second area surrounded by the first area, and the second area comprises one or more of light emitting areas in which one or more of pixels are disposed and one or more of transmissive areas; a pixel defining layer positioned between the plurality of pixels; and a metal layer positioned in the plurality of light emitting areas, wherein an end of the metal layer is aligned with a boundary between the light emitting area and the transmissive area, and an end of the pixel defining layer overlaps the light emitting area without extending to the boundary.

21 Claims, 5 Drawing Sheets

ND DEVICE

CROSS-REFERENCE TO RELATED APPLICATION

This application claims the benefit and priority from Republic of Korea Patent Application No. 10-2021-0183575, filed in the Republic of Korea on Dec. 21, 2021, which is hereby incorporated by reference in its entirety.

BACKGROUND

Technical Field

Embodiments of the present disclosure relate to a display device, and more particularly, to a display device capable of improving transmittance of an area in which a light sensor is disposed.

Description of the Related Art

As the information society develops, various display devices such as laptops, tablet PCs, smartphones, and smart watches are widely used. Such a display device has not only an image display function, but also a data generation function of various methods. The electronic device may include a display panel for the image display function and a light sensor for the data generation function. The light sensor may include, for example, a charge coupled device (CCD), a camera, and an infrared sensor.

The display panel includes a signal line or electrode pattern of a light-shielding material. Accordingly, in order to prevent light directed to the light sensor from being reflected or absorbed by the display panel, the light sensor may be disposed on the display panel. In this case, the image display function may be limited because a bezel width of the display panel may be increased due to that an area in which the light sensor is disposed or an area overlapping the light sensor among the display area of the display panel may be covered by the light sensor.

That is, since an image is not displayed in a portion of the display area of the display panel, it may be difficult to implement a full screen display.

SUMMARY

One or more embodiments of the present disclosure may provide a display device that reduces a cathode lifting phenomenon that may occur in a cathode patterning process related to formation of a transmissive area.

In one embodiment, a display device comprises: a display panel comprising a display area and a non-display area, the display area including a first area and a second area that is surrounded by the first area, and the second area includes one or more transmissive areas and one or more light emitting areas in which one or more pixels are disposed; a pixel defining layer between the one or more pixels; and a metal layer in the one or more light emitting areas, wherein an end of the metal layer is aligned with a boundary between a light emitting area from the one or more light emitting areas and a transmissive area from the one or more transmissive areas, and an end of the pixel defining layer overlaps the light emitting area and extends towards the boundary without reaching the boundary between the light emitting area and the transmissive area.

In one embodiment, a display device comprises: a display panel comprising a display area including a first area and a second area that is surrounded by the first area, the second area including a transmissive area and one or more light emitting areas having one or more pixels; a pixel defining layer between the one or more pixels, the pixel defining layer including an opening that overlaps the transmissive area and a light emitting area from the one or more light emitting areas; and a metal layer in the one or more light emitting areas, the metal layer including an opening that defines a width of the transmissive area, wherein a width of the opening in the pixel defining layer is wider than the width of the transmissive area.

According to embodiments of the present disclosure, it is possible to provide a display device capable of reduce the cathode lifting phenomenon in the formation of the transmissive area because the end of the pixel defining layer positioned in the region where the electronic sensor is disposed overlaps the light emitting area so that the cathode corresponds to the end of the pixel defining layer.

The above are example technical benefits that are expected from the present disclosure and one or more embodiments and the combination thereof may provide other technical benefits that are not mentioned above. Further, the embodiments provided herein address one or more problems in the related art including the example technical problem identified above.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
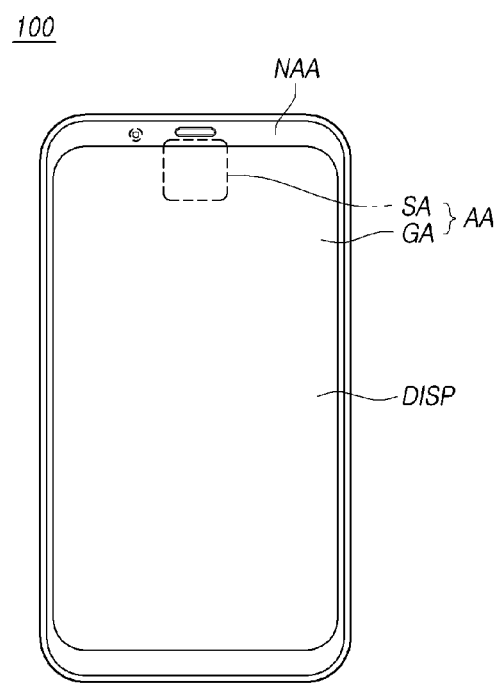
FIG. 1 illustrates one surface of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear.

The shapes, sizes, dimensions (e.g., width, length, height, thickness, area, radius, diameter, etc.), ratios, angles, the number of elements, and the like illustrated in the accompanying drawings for describing the embodiments of the present disclosure are merely examples, and the present disclosure is not limited thereto. In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

In interpreting the components, it is interpreted as including an error range even if there is no explicit description.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

The term "on" of another device or layer includes all cases in which another layer or other device is interposed immediately on or in the middle of another device or layer.

Although the first, second, and the like are used to describe various elements, these elements are not limited by these terms. These terms are only used to distinguish one component from another. Accordingly, the first component mentioned below may be the second component within the spirit of the present invention.

Like reference numerals refer to like elements throughout the specification.

The size and thickness of each component shown in the drawings are shown for convenience of description, and the present invention is not necessarily limited to the size and thickness of the illustrated component.

Each feature of the various embodiments of the present invention may be partially or wholly combined or combined with each other, and as those skilled in the art can fully understand, technically various interlocking and driving are possible, and each embodiment is implemented independently of each other It may be possible or may be implemented together in a related relationship.

The following terms are these terms defined in consideration of the function in the implementation of this specification. These may vary depending on the user, operator's intention or custom. Therefore, the definition must be made based on the contents of this specification and throughout the specification.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

Embodiments of the present specification will be mainly described with respect to an organic light emitting display device. However, embodiments of the present invention are not limited to the organic light emitting display device, and may be applied to various display devices including an inorganic light emitting display device including an inorganic light emitting material. For example, embodiments of the present invention may be applied to a quantum dot display device. Also, it may be applied to various devices capable of performing an inspection using an inspection device, even if it is not a display device.

Hereinafter, various embodiments of the present disclosure will be described in detail with reference to the accompanying drawings.

FIG. 1 illustrates one surface of a display device according to embodiments of the present disclosure. For example, one surface of the display device may be a front surface of the display device.

In FIG. 1, the display device 100 is implemented in the form of a smart phone, but the present invention is not limited thereto, and the display device 100 may be implemented as various electronic devices such as a smart watch, a tablet PC.

Referring to FIG. 1, the display device 100 may include a display panel DISP including an active area AA for an image display function and a non-active area (NAA) that does not display an image, and a light sensor (now shown) for an imaging function or sensing function.

The display panel DISP may be configured to display various contents on the display device 100 and may include, for example, a light emitting device such as an organic light emitting device, quantum dot light emitting device, inorganic light emitting device, etc. The display panel DISP may be disposed on the front surface of the display device 100. Descriptions of general contents that are easy for those of ordinary skill in the art in relation to the display panel DISP may be omitted from the present specification.

The light sensor may correspond to an optical element that detects light passing through the display panel DISP. For example, the light sensor may be the optical element that generates an electrical signal corresponding to the amount of light reflected by the target object, and may include at least one of a camera, a charge coupled device (CCD), and an infrared sensor.

A portion of the display area AA of the display panel DISP may overlap the light sensor disposed under the display panel DISP. In this case, the portion of the display area AA may corresponds to a sensing area SA or a light sensing area overlapping the light sensor, and the other portion of the display area AA may correspond to a general area GA that is differentiated from the sensing area SA.

In one embodiment, the sensing area SA may have an image display function and a light transmission function. For example, while an image is displayed in the sensing area SA, light directed to the light sensor may be transmitted. As such, an area through which the light directed to the light sensor is transmitted within the sensing area SA will be referred to as a transmissive area, an area other than the transmissive area within the sensing area SA will be referred to as a pixel area, but it is not limited to these terms.

In the embodiment, at least one pixel may be disposed in the sensing area SA and at least one pixel may be disposed in the general area GA. A density at which the pixels are disposed in the sensing area SA may be less than a density at which the pixels are disposed in the general area GA. That is, the pixel density of the sensing area SA may be smaller than the pixel density of the general area GA. The resolution of the sensing area SA may be less than that of the general area GA.

In FIG. 1, a case in which the sensing area SA is disposed in the upper center of the display device 100 is exemplarily illustrated, but the present invention is not limited thereto. The sensing area SA may be disposed in other parts of the display device 100. For example, the sensing area SA may be disposed at an upper left, upper right, center, lower left, lower right or lower center of the display device 100.

Hereinafter, the general area GA may be referred to as a first area and the sensing area SA may be referred to as a second area, but the embodiments are not limited thereto.

Figure 2:
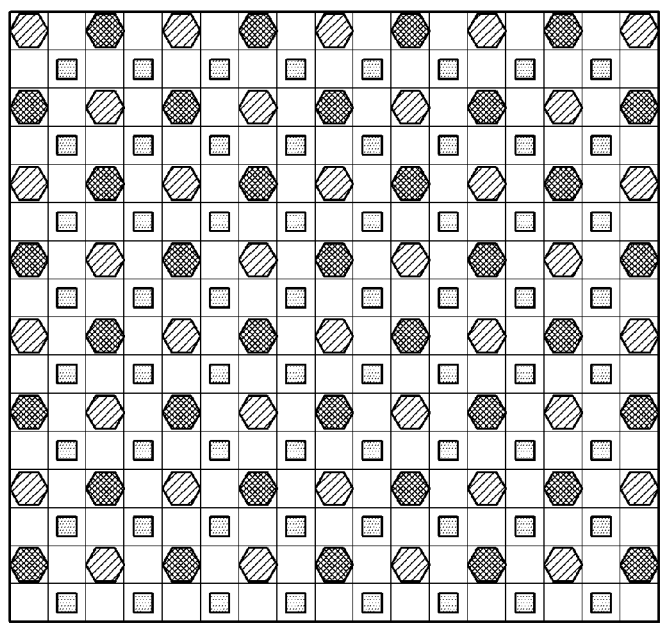
FIG. 2 is a plan view illustrating a pixel in a first area of a display device according to an embodiment of the present disclosure.

FIG. 2 is a plan view illustrating a pixel in a first area of a display device according to an embodiment of the present disclosure.

Referring to FIG. 2, the first area or the general area GA includes pixels arranged at high PPI (Pixels Per Inch). Each of the pixels may include at least one sub-pixel selected from among R (red), G (green), and B (blue) sub-pixels. In some cases, at least some of the pixels may further include a W (White) sub-pixel (not shown). But the embodiments of the present disclosure are not limited thereto. Other combinations of colors are also possible.

In the embodiment, the luminous efficiency of the light emitting device may be determined according to the color of the sub-pixel. In consideration of this, the size of the sub-pixels may be determined according to the color.

For example, the B sub-pixel may be the largest and the G sub-pixel may be the smallest among the R, G, and B sub-pixels.

The pixels may repeat in a first direction such as X-axis, a second direction such as Y-axis perpendicular to the first direction and an inclination angle direction such as ΘX and ΘY axes between the first and second directions. ΘX and ΘY indicate the direction of the inclination axis in which the X and Y axes are rotated by specific angle such 45°, respectively. But the embodiments of the present disclosure are not limited thereto. The specific angle could be any angle, such 30°, 60°, etc. between 0° and 90°.

Figure 3:
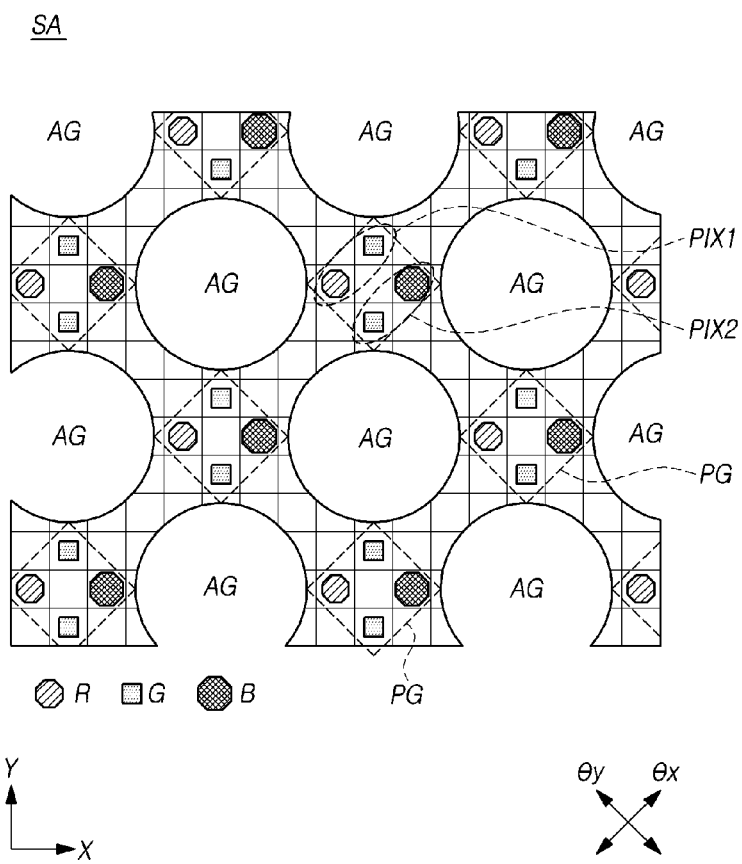
FIG. 3 is a plan view illustrating a pixel in a second area of a display device according to an embodiment of the present disclosure.

FIG. 3 is a plan view illustrating a pixel in a second area of a display device according to an embodiment of the present disclosure.

Referring to FIG. 3, the second area or the sensing area SA may include the transmissive area AG and a pixel group PG including at least one pixel. As described above, the second area SA may include a plurality of pixel groups and a plurality of transmissive areas. Each of the pixel groups PG may be disposed to be spaced apart from each other by a predetermined distance. The transmissive area AG may be disposed in a space between the pixel groups PG.

Light from the outside of the display device may be received through the transmissive area AG by a lens disposed to correspond to the transmissive area AG. The transmissive area AG may include a transparent medium having high transmittance. The transmissive area AG may include a non-metal material. For example, the transmissive area AG may be composed of a transparent insulating material without including metal lines or pixels. According to the embodiment, the transmissive areas AG may be defined as areas in which all metal layers are removed from the screen, but it is not limited thereto.

The transmittance of the display area may be determined according to at least one of the number and the size of the transmissive areas AG. For example, the transmittance of the display area may have a higher value as the size of the transmissive area AG increases or the number of the transmissive areas AG increases. Since the transmissive area AG is disposed in the second area SA, the transmittance of the second area SA may be greater than that of the first area GA, by comparing FIGS. 2 and 3. Accordingly, the PPI of the second area SA may be less than the PPI of the first area GA.

The pixel group PG may include at least one sub-pixel corresponding to one of R, G, and B sub-pixels. For example, as described above, the pixel group PG may include one sub-pixel corresponding to R, two sub-pixels corresponding to G, and one sub-pixel corresponding to B.

In the embodiment, the pixel group PG disposed in the second area SA may include two pixels PIX1 and PIX2 each including at least one sub-pixel. Specifically, the pixel group PG may include a first pixel PIX1 and a second pixel PIX2.

The first pixel PIX1 may include R and G sub-pixels, and the second pixel PIX2 may include B and G sub-pixels.

Based on the sub-pixel rendering algorithm, insufficient color representation in each of the first and second pixels PIX1 and PIX2 may be compensated for with an average value of corresponding color data between neighboring pixels. For example, white may be expressed by combining the R, G, and B sub-pixels of the first and second pixels PIX1 and PIX2.

The shape of the transmissive area AG and the arrangement shape of the pixel group PG may be implemented in various forms. For example, the transmissive area AG may be formed in a circular or elliptical shape. In this case, a captured image in which a flare phenomenon is reduced may be obtained, and transmittance of the second area SA may be improved. For example, the pixel group PG may be formed in a circular shape, an oval shape, a rhombus shape, or a square shape.

As described above, the metal may not be included in the transmissive area AG. To this end, the metal used as a cathode electrode (hereinafter referred to as a cathode) in the manufacturing step of the display panel DISP may be removed in the transmissive area AG. For example, at first, the metal used as the cathode may be uniformly deposited on the second area SA. Thereafter, the metal in the area corresponding to the transmissive area AG may be removed from the second area SA using a specific process such as a laser process or an etching process.

Each of the pixel groups PG may include a circuit layer in which a pixel circuit of each sub-pixel is disposed and a light emitting device. At least a portion of the circuit layer and the light emitting device layer may overlap with each other or be spatially separated from each other.

The circuit layers of the pixel group PG may be arranged to correspond to an arrangement shape of the pixel group PG. For example, when the pixel group PG is arranged in the rhombus or the square, the circuit layer may also be arranged in the rhombus or the square.

Figure 4:
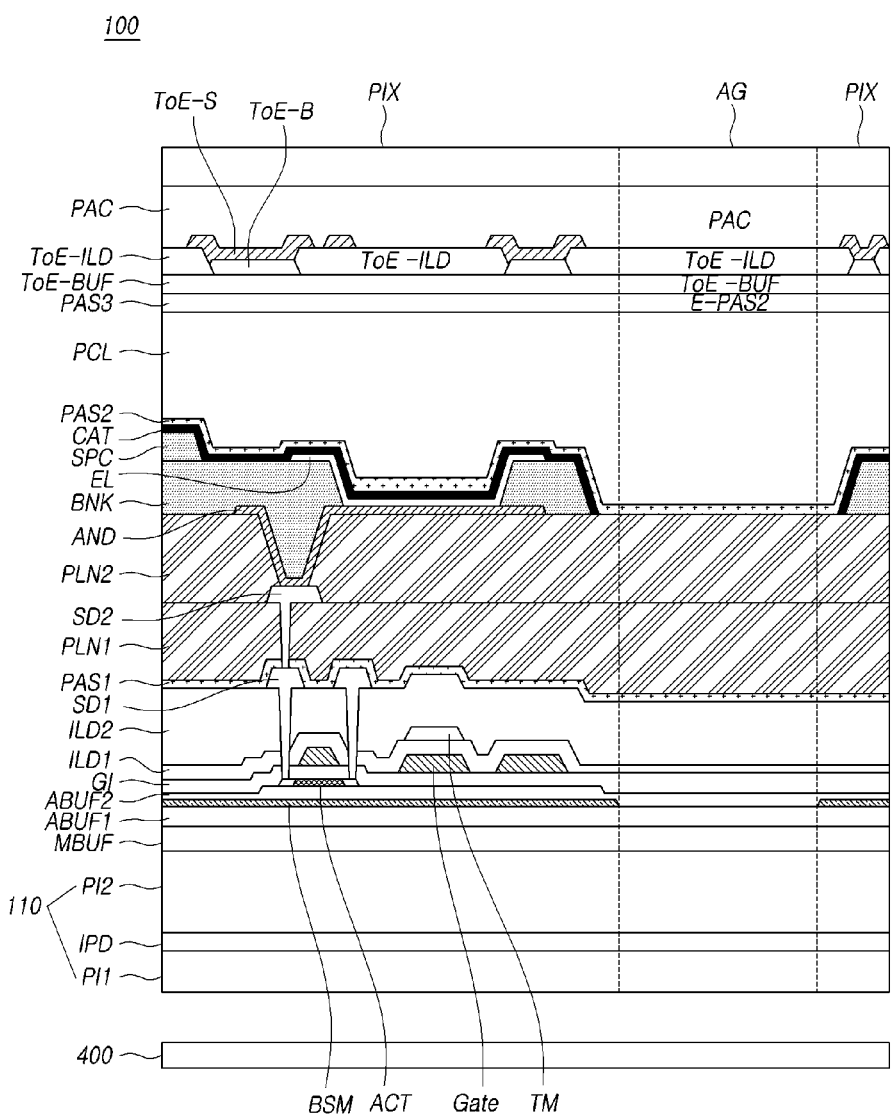
FIG. 4 is a cross-sectional view of a display device according to an embodiment of the present disclosure.
Figure 5:
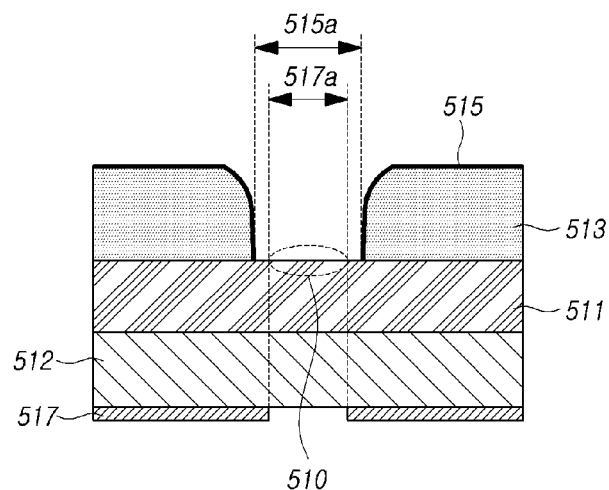
FIG. 5 is a cross-sectional view for explaining a transmissive area of FIG. 4 according to an embodiment of the present disclosure.

FIG. 4 is a cross-sectional view of a display device according to an embodiment of the present disclosure. FIG. 5 is an example of a cross-sectional structure of the transmissive area and another area in the display device according to an embodiment of the present disclosure. In FIG. 4, TFT represents a driving transistor DT of a pixel circuit.

Referring to FIG. 4, a circuit layer, a light emitting device layer, and the like may be stacked on substrates such as a flexible substrates PI1 and PI2 in the pixel area PIX. The flexible substrates PI1 and PI2 may include a first PI substrate PI1 and a second PI substrate PI2. An interlayer shielding layer IPD may be positioned between the first PI substrate PI1 and the second PI substrate PI2. But the embodiments of the present disclosure are not limited thereto. There could be only one flexible substrate, or one or more rigid substrates.

The first and second substrates PI1 and PI2 may be composed of a polymer such as polyimide. For example, the polyimide is the polymer having a relatively low crystallinity or mostly an amorphous structure. It may be easily synthesized to form a thin film, and has the advantage of not requiring a crosslinking group for curing, as well as excellent heat and chemical resistance, excellent mechanical properties, electrical properties and dimensional stability due to transparency and a rigid chain structure.

However, this polyimide may have high hygroscopicity with a water vapor transmission rate (WVTR) of several to several tens of g/m2/24 hr.

Accordingly, when the first and second substrates PI1 and PI2 are composed of polyimide, a large amount of moisture such as $H_2O$ is introduced from the outside through the flexible substrate 110. At this time, H+ and OH− ions of $H_2O$ may be diffused toward the switching and driving transistor such as thin film transistor TFT, and the diffused ions may act as mobile charges to influence the property of the switching and driving transistor, such as threshold voltage. Accordingly, the device performance of the switching and driving transistors is deteriorated.

The interlayer shielding layer IPD is composed of an inorganic insulating material such as silicon nitride (SiNx) and silicon oxide (SiOx), and have the WVTR of about 1/1000 or less than that of polyimide of the first and second substrates PI1 and PI2.

The interlayer insulating layer IPD is positioned between the first substrate PI1 and the second substrate PI2 so that moisture penetration through the flexible substrate 110 can be prevented.

The first buffer layer MBUF may be formed on the second substrate PI2. The first buffer layer MBUF is a buffer layer in which a plurality of thin films are sequentially stacked. For example, silicon nitride (SiNx) and silicon oxide (SiOx) may be alternately stacked on the second substrate PI2 to form the first buffer layer MBUF. Alternatively, an organic film and an inorganic film may be repeatedly laminated alternately on the second substrate PI2 to form the first buffer layer MBUF.

The first buffer layer MBUF serves to delay diffusion of the moisture and/or oxygen penetrating into the flexible substrates 110.

A second buffer layer ABUF1 may be disposed on the first buffer layer MBUF. A first metal layer BSM may be disposed on the second buffer layer ABUF1. A third buffer layer ABUF2 may be disposed on the first metal layer BSM. Each of the second and third buffer layers ABUF1 and ABUF2 serves to protect the active layer ACT of the switching and driving transistor TFT, and performs a function of blocking various types of defects flowing from the flexible substrates 110. The second and third buffer layers ABUF1 and ABUF2 may be composed of the same material as the first buffer layer MBUF, and may be formed of amorphous silicon (a-Si) or the like.

In some cases, the first metal layer BSM may be composed under the first buffer layer MBUF. In this case, the first to third buffer layers MBUF, ABUF1, and ABUF2 may be formed on the first metal layer BSM.

The first metal layer BSM may be patterned in a display manufacturing process such as a photo-lithography process. The first metal layer BSM may include a light shield pattern. The light shield pattern blocks external light so that light is not irradiated to the active layer ACT of the driving transistor TFT, thereby preventing a photo current of the driving transistor TFT in the pixel region. As the light shield pattern is formed of a metal having a lower absorption coefficient of a laser wavelength used in a laser ablation process compared to an absorption coefficient of a metal layer (e.g., the cathode) to be removed from the sensing area SA, it may serve as a light shielding layer blocking a laser beam LB in the laser ablation process.

The active layer ACT may be disposed on the third buffer layer ABUF2. For example, the active layer ACT may be formed of a semiconductor material on the third buffer layer ABUF2 and patterned by a photo-lithography process. The active layer ACT may include an active pattern of each of the TFTs of the pixel circuit and the TFTs of the gate driver. A portion of the active layer ACT may be metallized by a specific process such as ion doping. The metallized portion may be used as a jumper pattern connecting metal layers to some nodes of the pixel circuit to connect components of the pixel circuit.

A gate insulating layer GI may be disposed on the third buffer layer ABUF2 to cover the active layer ACT. The gate insulating layer GI may be formed of an inorganic insulating material. For example, the gate insulating layer GI may be composed of a single layer of silicon nitride (SiNx) or silicon oxide (SiOx), or may be composed of multiple layers of silicon nitride (SiNx) and silicon oxide (SiOx).

A second metal layer GATE may be disposed on the gate insulating layer GI. The second metal layer GATE may be patterned by a photo-lithography process. The second metal layer GATE may be used as a gate line, a gate electrode, a lower electrode of a storage capacitor, or a jumper pattern connecting patterns of the first metal layer BSM, the third metal layer TM and the like.

A first interlayer insulating layer ILD1 can be disposed on the gate insulating layer GI to cover the second metal layer GATE. The first interlayer insulating layer ILD1 is made of silicon nitride (SiNx) so that there may allow hydrogen included in the first interlayer insulating layer ILD1 made of silicon nitride (SiNx) to diffuse into the active layer ACT during the hydrogenation process for stabilizing the active layer ACT.

A third metal pattern TM may be disposed on the first interlayer insulating layer ILD1. The second interlayer insulating layer ILD2 may be disposed while covering the third metal pattern TM on the first interlayer insulating layer ILD1. The third metal layer TM may be patterned by a photo-lithography process. The third metal layer TM may include metal patterns such as the upper electrode of the storage capacitor. The second interlayer insulating layer ILD2 is formed on the entire surface of the flexible substrate 110 and may be composed of silicon oxide (SiOx).

A fourth metal layer SD1 may be disposed on the second interlayer insulating layer ILD2. One portion of the fourth metal layer may be a source node of the driving transistor TFT, and another portion of the fourth metal layer may be a drain node of the driving transistor TFT. A first inorganic insulating layer PAS1 and a first planarization layer PLN1 may be stacked on the fourth metal layer SD1. A fifth metal layer SD2 may be formed on the first planarization layer PLN1. A second planarization layers PLN2 is disposed on the fifth metal layer SD2. The first and second planarization layers PLN1 and PLN2 may be formed of an organic insulating material for flattening surfaces.

For example, the first and second planarization layers PLN1 and PLN2 may be made of one or more materials among acrylic resin such as polyacrylate resin, epoxy resin, phenolic resin, polyamides resin, polyimides resin, unsaturated polyesters resin, poly-phenylene ethers resin, polyphenylenesulfides resin, and benzocyclobutene, but they are not limited thereto. The first and second planarization layers PLN1 and PLN2 may be formed as a single layer or may be configured as double or multiple layers.

The fourth metal layer SD1 may be connected to the first and second electrodes of the TFT connected to the active pattern of the TFT through a contact hole penetrating the second interlayer insulating layer ILD2. The data line and the power line may be implemented with the fourth metal layer SD1 or the fifth metal layer SD2.

The anode electrode (hereinafter, the anode) AND, which is the first electrode layer of the light emitting device OLED, may be formed on the second planarization layer PLN2. The anode AND may be connected to the electrode of the driving transistor TFT through a contact hole passing through the second planarization layer PLN2. The anode AND may be formed of a transparent or translucent electrode material.

The pixel defining layer or bank BNK may cover the anode AND of the light emitting device OLED. The pixel defining layer BNK may be formed in a pattern defining a light emitting area or an opening area through which light passes from each of the pixels to the outside. The pixel defining layer BNK may be formed of an organic material. For example, the pixel defining layer BNK may be composed of polyimide, acryl, or benzocyclobutene-based resin, but it is not limited thereto. A spacer SPC may be formed on the pixel defining layer BNK.

In some cases, the pixel defining layer BNK and the spacer SPC may be integrated with the same organic insulating material. The spacer SPC may secure a gap between the fine metal mask (FMM) and the anode AND so that the fine metal mask does not come into contact with the anode AND in the deposition process of a light emitting layer EL or organic compound.

The light emitting layer EL may be formed in the light emitting area of each of the pixels defined by the pixel defining layer BNK. The cathode electrode (hereinafter, the cathode) CAT, which is the second electrode layer of the light emitting device OLED, may be formed on the entire surface of the display device 100 to cover the pixel defining layer BNK, the spacer SPC, and the light emitting layer EL. The cathode CAT may be connected to a base voltage line formed of any one of the metal layers thereunder.

Although not shown, a capping layer CPL may be disposed on the cathode CAT. The capping layer CPL may cover the cathode CAT. The capping layer CPL may be formed of an inorganic insulating material to block or at least reduce penetration of air and out gassing of an organic insulating material applied on the capping layer CPL to protect the cathode CAT. An encapsulation layer may be disposed on the capping layer CPL. The capping layer CPL according to an embodiment may be included in the encapsulation layer.

The encapsulation layer may include inorganic insulating layers PAS2 and PAS3 and a foreign material compensation layer PCL between the inorganic insulating layers PAS2 and PAS3. For example, the second inorganic insulating layer PAS2 may cover the capping layer CPL, and the foreign material compensation layer PCL may be formed on the second inorganic insulating layer PAS2.

The foreign material compensation layer PCL is formed of an organic material. Silicon oxycarbon (SiOCz), or acryl or epoxy-based resin may be used for the foreign material compensation layer PCL, but is not limited thereto.

As an example, the foreign material compensation layer PCL may be formed of the SiOCz by a CVD process. The SiOCz is classified as the inorganic material in general, but can be classified as an organic material under certain conditions. Specifically, the SiOCz has different flowability depending on the atomic ratio C/Si of silicon and carbon. For example, since the SiOCz has properties close to the inorganic material when its flowability deteriorates, there may be lowered the performance of compensating for foreign substances. Since the SiOCz has properties close to the organic materials when its flowability deteriorates, there may be lowered the performance of compensating for foreign substances. Conversely, since the SiOCz has properties close to organic materials when its flowability is improved, there may be improved the performance of compensating for foreign materials. The atomic ratio C/Si ratio of the SiOCz may be controlled by adjusting the ratio of oxygen ($O_2$) and hexamethyldisiloxane (HMDSO) during the CVD process. In particular, when the foreign material compensation layer PCL is formed of the SiOCz, the thickness of the encapsulation layer may be implemented to be very thin, and the thickness of the display device may be reduced.

As another example, when the foreign material compensation layer PCL is formed of the acrylic or epoxy-based resin by a slit coating or screen printing process. In this case, high-viscosity bisphenol-A-epoxy or low-viscosity bisphenol-F-epoxy may be used as the epoxy-based resin.

The foreign material compensation layer PCL may further include an additive. For example, a wetting agent for reducing the surface tension of the resin to improve the surface uniformity thereof, a leveling agent for improving the surface flatness of the resin, and an antifoaming agent or a defoaming agent for removing air bubbles contained in the resin may be further added as an additive. The foreign material compensation layer PCL may further include an initiator. For example, it is possible to use an antimony-based initiator or anhydride-based initiator that hardens a liquid resin by initiating a chain reaction by heat.

Additionally, when the temperature of the resin rises, the viscosity of the liquid resin rapidly decreases, and after a certain period of time, curing starts and the viscosity increases rapidly to complete the curing. However, since the resin has high fluidity during a certain period of time when the viscosity is lowered, the possibility of overspraying at this time is particularly increased.

The foreign material compensation layer PCL functions to cover the foreign materials or particles that may be generated during the process. For example, defects due to cracks generated by foreign materials or the particles may exist in the second inorganic insulating layer PAS2. However, these cracks and foreign materials may be covered by the foreign material compensation layer PCL, and the upper surface of the foreign material compensation layer PCL is planarized. That is, the foreign material compensation layer PCL compensates for the foreign material and planarizes the display area AA. As a result, the foreign material compensation layer PCL may be referred to as a compensation layer.

The third inorganic insulating layer PAS3 is formed on the foreign material compensation layer PCL and the second inorganic insulating layer PAS2. The second inorganic insulating layer PAS2 and the third inorganic insulating layer PAS3 are formed to contact each other at the outer portion of the display panel DISP. That is, the foreign material compensation layer PCL may be sealed by the second inorganic insulating layer PAS2 and the third inorganic insulating layer PAS3. According to this structure, the foreign material compensation layer PCL is sealed by the second inorganic insulating layer PAS2 and the third inorganic insulating layer (PAS3), so that the direct moisture penetration path through the foreign material compensation layer PCL is suppressed.

A touch configuration may be disposed on the third inorganic insulating layer PAS3. For example, a touch buffer ToE-BUF and a touch insulating layer ToE-ILD may be disposed on the third inorganic insulating layer PAS3. A touch bridge ToE-B and a touch sensor ToE-S may be disposed in a hole formed in at least a portion of the touch insulating layer ToE-ILD. At least a portion of the touch sensor ToE-S may be disposed on the touch bridge ToEB, and at least another portion of the touch sensor ToE-S may be disposed on the touch insulating layer ToE-ILD.

A protective layer PAC may be disposed on the touch insulating layer ToE-ILD and the touch sensor ToE-S. The protective layer PAC may be an organic insulating layer including an organic material such as photo-acryl.

Referring to FIG. 4, although the cathode CAT is disposed in the pixel area PIX, it may be omitted in the transmissive area AG between the pixel areas PIX to improve transmittance of the sensing area SA. Accordingly, an opening in which the cathode CAT is omitted may be formed. That is, the cathode CAT may be formed up to the boundary of the opening. In this case, the opening may be formed as much as an area corresponding to the transmissive area AG. After forming the cathode CAT on the pixel defining layer BNK, the opening may be formed through laser irradiation using the lower first metal layer BSM as a mask. However, the present invention is not necessarily limited thereto and may be formed in various ways.

If the end of the pixel defining layer BNK located in the pixel area PIX and adjacent to the transmissive area AG coincides (e.g., is aligned) with the end of the first metal layer BSM serving as a mask during laser processing, the cathode CAT positioned at the end of the pixel defining layer BNK may be lifted when the cathode CAT is removed because the effective processing area of the laser for removing the cathode CAT overlaps with the end of the pixel defining layer BNK. For example, when the lift of the cathode CAT exceeds 3000 Å, the probability of occurrence of a defect may increase.

The sensor 400 may be disposed in the sensing area SA. Specifically, the sensor 400 may be disposed in at least a portion of an area corresponding to the sensing area SA of the display panel. For example, the sensor 400 may be disposed below the transmissive area AG and below the pixel area PIX adjacent to the transmissive area AG. The sensor 400 may include the light sensor, but it is not limited thereto. For example, the sensor 400 may include various types of sensors such as an infrared sensor and an ultraviolet sensor.

An end of the first metal layer BSM formed in the pixel area PIX may extend to the boundary between the transmissive area AG and the pixel area PIX. An end of the pixel defining layer BNK formed in the pixel area PIX may be located in the pixel area PIX rather than the end of the first metal layer BSM. Thus, the end of the pixel defining layer BNK is farther from the transmissive area AG than the end of the first metal layer BSM. In one embodiment, the end of the pixel defining layer BNK extends towards the boundary without reaching the boundary. An end portion of the cathode CAT positioned to cover the upper surface of the pixel defining layer BNK is non-overlapping with an end portion of the first metal layer BSM. For example, the end portions of the pixel defining layer BNK and the cathode positioned in the pixel region PIX and adjacent to the transmissive region AG are located more inside the pixel region PIX rather than the ends of the first metal layer BSM. That is, the ends of the pixel defining layer BNK and the cathode CAT adjacent to the transmissive region AG are not aligned with the ends of the first metal layer BSM. For example, the end of the pixel defining layer BNK adjacent to the transmissive area AG may be positioned to coincide (e.g., align) with an outer periphery of the effective processing area of the laser for removing the cathode CAT.

FIG. 5 is a cross-sectional view for explaining a transmissive area of FIG. 4 according to one embodiment. Specifically, FIG. 5 conceptually illustrates an example of a cross-section when the first metal layer BSM (517), the pixel defining layer BNK (513), and the cathode CAT (515) are disposed around the transmissive area. As shown in FIG. 5, a planarization layers 512 and 511 (e.g., the first planarization layer PLN1 and the second planarization layer PLN2) are between the pixel defining layer BNK 513 and the metal layer 517.

Referring to FIG. 5, the transmissive area AG may include an opening 510 in the pixel defining layer BNK 513 in which the cathode 515 is omitted. The width 515a of the opening 510 may be larger than the width 517a of the transmissive area AG. That is, an end portion of the pixel defining layer 513 adjacent to the transmissive area AG may be disposed more inside the pixel region PIX (i.e., is more inset) rather than at an end portion of the first metal layer 517. For example, a distance between the pixel defining layers BNK adjacent to each other with the transmissive area AG interposed therebetween due to the opening in the pixel defining layers BNK may be greater than a distance between the first metal layers 517 adjacent to each other with the transmissive region AG interposed therebetween. As shown in FIG. 5, the metal layer 517 includes an opening that overlaps the transmissive area AG. In one embodiment, the width of the opening in the metal layer 517 defines the width 517a of the transmissive area AG.

The cathode 515 may be omitted in the transmissive area AG between the pixel areas PIX to improve the transmittance of the sensing area SA. Accordingly, an opening in which the cathode CAT is omitted may be formed. As described above, after the pixel defining layer BNK is formed, the cathode CAT may be formed on the entire surface of the sensing area SA. After the cathode 515 is formed, a laser may be irradiated using the first metal layer 517 positioned below as a mask. Through this, the cathode 515 on the transmissive area AG may be removed. The effective processing area of the laser may be wider than the gap 517a between the first metal layers 517.

In this embodiment, since the end of the pixel defining layer 513 is formed to match the laser effective processing area, the end of the pixel defining layer 513 is formed to coincide (align) with the end of the cathode 515. When the cathode 515 formed on the pixel defining layer 513 is removed, a phenomenon in which an end of the cathode 515 is lifted can be reduced. For example, the lifting of the tip of the cathode 515 may be less than 3000 Å. As described above, it is possible to prevent defects such as moisture permeation by reducing the lifting of the end of the cathode.

Referring back to FIGS. 1 to 3, the display device 100 according to one embodiment of the present disclosure includes the display panel DISP including the display area AA and the non-display area NAA. The display area AA includes the first area and the second area surrounded by the first area. As described above, the first area may be the general area GA, and the second area may be the sensing area SA. The second area may include one or more of light emitting areas in which one or more of pixels are disposed and one or more of transmissive areas.

Referring back to FIGS. 4 and 5, the pixel defining layer BNK or 513 may be positioned between the plurality of pixels. The metal layer BSM may be positioned in the plurality of light emitting areas. An end of the metal layer BSM is aligned with a boundary between the light emitting area and the transmissive area AG, and an end of the pixel defining layer BNK or 513 overlaps the light emitting area.

In an embodiment, an end of the metal layer BSM may be closer to the transmissive area than an end of the pixel defining layer BNK or 513.

In an embodiment, the thin film transistor may be further included between the metal layer BSM and the pixel defining layer BNK or 513.

In an embodiment, there may further be included a light emitting device OLED disposed on the thin film transistor and electrically connected thereto. In an embodiment, the light emitting device OLED may include the anode electrode AND, the light emitting layer EL, and the cathode CAT.

In an embodiment, the cathode CAT may cover the pixel defining layer BNK or 513. In an embodiment, the cathode CAT may be omitted in the transmissive area.

In an embodiment, the plane of the transmissive area may correspond to a circle or a polygon.

In an embodiment, the pixel density of the second area may be greater than the pixel density of the first area.

In an embodiment, a distance between the pixel defining layers BNK or 513 adjacent to each other with the transmissive area interposed therebetween may be less than a distance between the metal layers BSM.

In an embodiment, the display device 100 may further include the light sensor positioned under the display panel DISP and overlapping at least a portion of the second area. In an embodiment, the light sensor may include at least one of a camera and an infrared sensor.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown. The scope of protection of the present disclosure includes all technical ideas and its equivalents described within the present disclosure.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
    a display panel comprising a display area and a non-display area, the display area including a first area and a second area that is surrounded by the first area, and the second area includes one or more transmissive areas and one or more light emitting areas in which one or more pixels are disposed;
    a pixel defining layer between the one or more pixels; and
    a metal layer in the one or more light emitting areas,
    wherein an end of the metal layer is aligned with a boundary between a light emitting area from the one or more light emitting areas and a transmissive area from the one or more transmissive areas, and an end of the pixel defining layer overlaps the light emitting area and extends towards the boundary without reaching the boundary between the light emitting area and the transmissive area,
    wherein the end of the metal layer is closer to the transmissive area than the end of the pixel defining layer,
    wherein a pixel density of the one or more pixels in the second area is less than a pixel density of a plurality of pixels in the first area.

2. The display device of claim 1, further comprising:
    a thin film transistor between the metal layer and the pixel defining layer in the light emitting area.

3. The display device of claim 2, wherein the metal layer includes a light shield pattern that overlaps the thin film transistor, the light shield pattern configured to block external light from being irradiated to the thin film transistor.

4. The display device of claim 2, further comprising:
    a light emitting element on the thin film transistor in the light emitting area, the light emitting element electrically connected to the thin film transistor.

5. The display device of claim 4, wherein the light emitting element includes an anode electrode, a light emitting layer on the anode electrode, and a cathode electrode on the light emitting layer.

6. The display device of claim 5, wherein the end of the pixel defining layer is aligned with an end of the cathode electrode.

7. The display device of claim 5, wherein the cathode electrode covers the pixel defining layer.

8. The display device of claim 6, wherein the cathode electrode extends to the end of the pixel defining layer in the light emitting area without extending to the transmissive area.

9. The display device of claim 8, wherein a distance between the pixel defining layer and an adjacent pixel defining layer with the transmissive area interposed therebetween is less than a distance between the metal layer and an adjacent metal layer with the transmissive area interposed therebetween.

10. The display device of claim 9, wherein the transmissive area that lacks the cathode electrode includes an opening.

11. The display device of claim 10, wherein a width of the opening is wider than a width of the transmissive area.

12. The display device of claim 10, wherein the metal layer is configured as a mask to form the opening using a laser.

13. The display device of claim 12, wherein the metal layer includes a metal having a lower absorption coefficient of a laser wavelength of the laser compared to an absorption coefficient of the cathode electrode.

14. The display device of claim 12, wherein an effective processing area of the laser is wider than a distance between the metal layer and the adjacent metal layer with the transmissive area interposed therebetween.

15. The display device of claim 14, wherein the end of the pixel defining layer is aligned with an outer periphery of the effective processing area of the laser.

16. The display device of claim 7, wherein the transmissive area has to a circle shape or a polygon shape in a plane view of the display device.

17. The display device of claim 1, further comprising:
a light sensor under the display panel, the light sensor overlapping at least a portion of the second area.

18. The display device of claim 17, wherein the light sensor comprises at least one of a camera or an infrared sensor.

19. A display device comprising:
a display panel comprising a display area including a first area and a second area that is surrounded by the first area, the second area including a transmissive area and one or more light emitting areas having one or more pixels;
a pixel defining layer between the one or more pixels, the pixel defining layer including an opening that overlaps the transmissive area and a light emitting area from the one or more light emitting areas;
a metal layer in the one or more light emitting areas, the metal layer including an opening that defines a width of the transmissive area;
a light emitting element including an anode electrode, a light emitting layer on the anode electrode, and a cathode electrode,
wherein the cathode electrode is on the pixel defining layer and an end of the cathode electrode is aligned with the pixel defining layer,
wherein a width of the opening in the pixel defining layer is wider than the width of the transmissive area,
wherein an end of the pixel defining layer extends towards a boundary between the transmissive area and the light emitting area without reaching the boundary.

20. The display device of claim 19, wherein the end of the metal layer is closer to the transmissive area than the end of the pixel defining layer and the end of the cathode electrode.

21. The display device of claim 19, further comprising:
a transistor that is electrically connected to the light emitting element,
wherein the metal layer overlaps the transistor.

* * * * *